United States Patent [19]

Summers

[11] 4,422,176
[45] Dec. 20, 1983

[54] PHASE SENSITIVE DETECTOR

[75] Inventor: Christopher P. Summers, London, England

[73] Assignee: U.S. Philips Corporation, New York, N.Y.

[21] Appl. No.: 325,480

[22] Filed: Nov. 27, 1981

[30] Foreign Application Priority Data

Dec. 12, 1980 [GB] United Kingdom ............... 8039873
Dec. 12, 1980 [GB] United Kingdom ............... 8039874

[51] Int. Cl.³ ............................................. H03L 7/06
[52] U.S. Cl. .................................. 375/120; 307/516; 307/527; 328/133
[58] Field of Search ............... 307/514, 516, 518, 527, 307/528, 269; 328/133, 62; 329/122, 126; 331/1 A; 360/51; 375/119, 120, 82; 358/148, 158

[56] References Cited

U.S. PATENT DOCUMENTS 4,010,323 3/1977 Peck .................................. 375/119
4,151,485 4/1979 LaFratta ........................... 331/1 A
4,222,009 9/1980 Moulton et al. .................. 375/120

Primary Examiner—Benedict V. Safourek
Attorney, Agent, or Firm—Thomas A. Briody; William J. Streeter; Edward W. Goodman

[57] ABSTRACT

As shown in FIG. 7, a phase sensitive detector comprises two D-type flip-flops 701 and 702 which are arranged so that in response to data pulses DP and clock pulses CK they produce respective pulse sequences D1 and D2. FIG. 8 shows the relative timing of these pulses and pulse sequences. An exclusive OR-gate 703 receives the pulse sequences D1 and D2, and an exclusive OR-gate 704 receives the pulse sequence D1 and the data pulses DP. The clock pulses CK can be up to one half a clock pulse period late or up to one half a clock pulse period early relative to a desired phase relationship of the clock pulses CK with the data pulses DP. According as the actual relative phase is correct, late or early, the duration of the logic output from the gate 704 will be the same as, proportionately longer than, or proportionately shorter than, the duration of the logic output from the gate 703. The two gate outputs control respective current sources 707 and 708 of a current source circuit 705 to drive current into and extract current from a capacitor 203. The voltage across the capacitor 203 serves as a control voltage for altering the phase of the clock pulses CK, as produced by some form of oscillator, to tend to bring it into the desired phase relationship with the data pulses DP.

7 Claims, 13 Drawing Figures

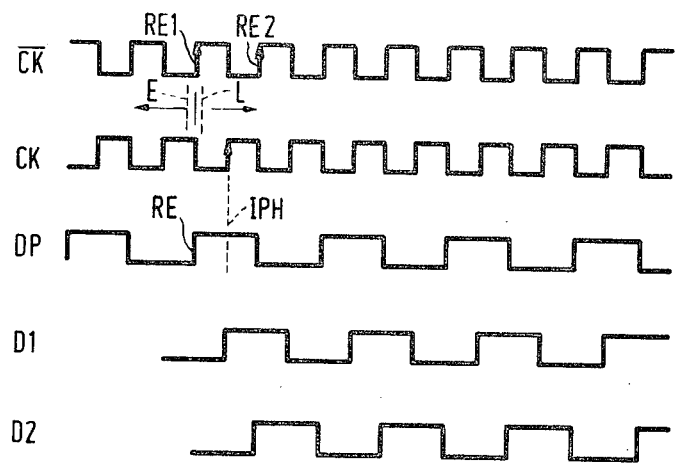
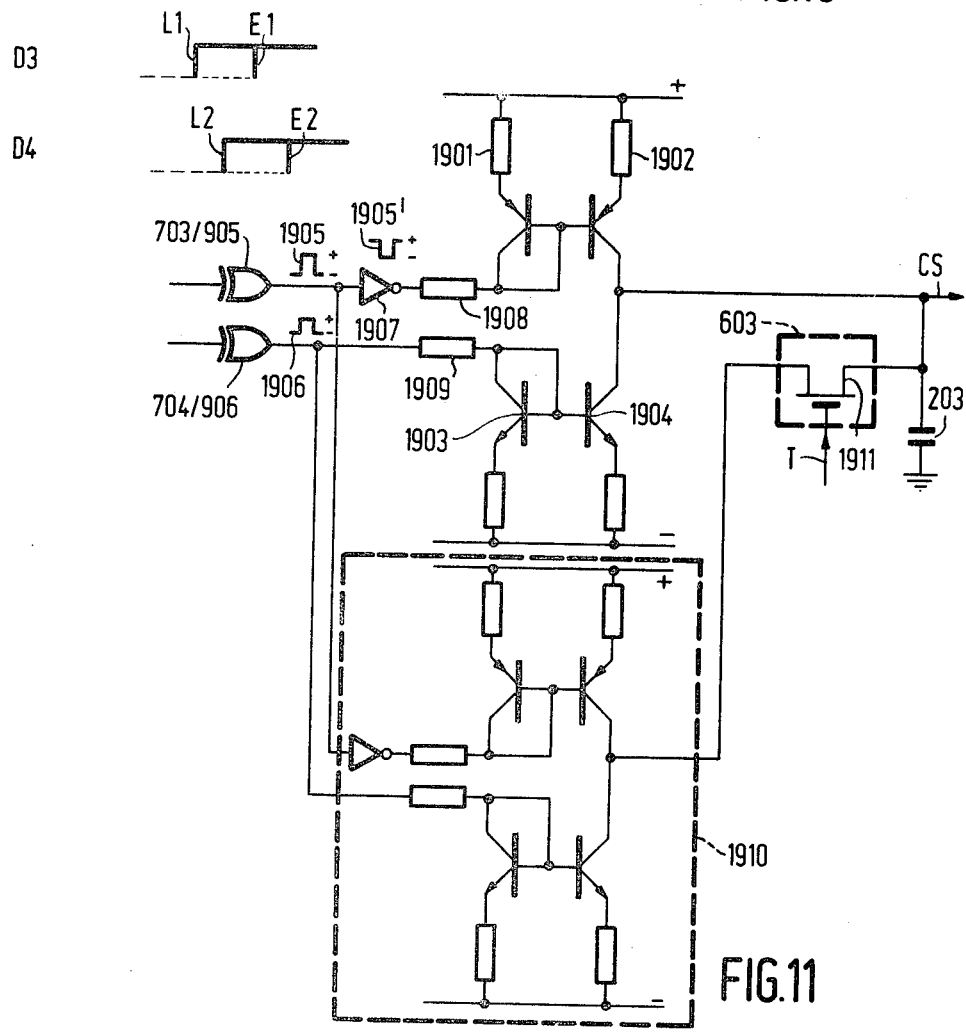
FIG.10
FIG.11

PHASE SENSITIVE DETECTOR

BACKGROUND OF THE INVENTION

This invention relates to a data pulse receiver arrangement of a type suitable for the acquisition of data pulses of the NRZ (nonreturn to zero) type which occur in a serial bit stream in a received information signal in which one level of the signal (say high) represents a binary value '1' and another level of the signal (say low) represents a binary value '0', said arrangement including a data clock pulse generator which produces clock pulses for clocking the data pulses into the data pulse receiver arrangement, the period of a clock pulse cycle being equal to a data bit period. (A data pulse receiver arrangement of the above type is known, for instance, from Mullard Technical Information Article 54, dated August 1977).

The invention relates more particularly to a phase sensitive detector in, or for use with, such a data clock pulse generator for producing a control signal which is indicative of a phase discrepancy between the data pulses and the clock pulses and which can be used to correct the phase of the clock pulses generated to achieve the required phase relationship between the data pulses and the clock pulses.

Phase sensitive detectors which operate in digital fashion have already been used extensively for detecting the phase of a data pulse clock relative to a serial bit stream of data pulses, and for producing a control signal which is indicative of the phase discrepancy. In some forms of such phase sensitive detectors, it is known to use D-type flip-flop for detecting the relative timing of data pulses and clock pulses.

One example of this form of phase detector is described in U.S. Pat. No. 3,986,125, and another example is described in U.K. patent specification No. 1,445,725. In these known forms of phase sensitive detector, it is the practice for only one edge, usually the leading edge, of a received data pulse to be used for detecting the relative timing of data pulses and clock pulses. This practice is clearly evidenced in the two specific prior art examples mentioned above, in each of which examples, the clock input of the D-type flip-flop receives the data pulses and the D input receives the clock pulses.

Where a serial bit stream of data pulses is deemed to be "continuous" by virtue of the fact that a succession of its data pulses occur for a significant duration with interruption, a phase sensitive detective which operates only on one edge of the received data pulses is able nevertheless to perform sufficient phase detections to produce a control signal which indicates the phase discrepancy between data pulses and clock pulses with acceptable accuracy. Also, since the data pulses are "continuous" the control signal can be altered continually to indicate any drift from the required phase relationship.

However, situations can occur where data pulses of a serial bit stream are received in short bursts with relatively lone interruptions between successive bursts. In such a situation, a phase sensitive detector which operates only on one edge of the received data pulses may not be able to perform sufficient phase detections in response to a short burst of data pulses to produce a sufficiently accurate control signal for indicating phase discrepancy between the data pulses and the clock pulses.

In particular, such a situation occurs in a television transmission system of a character in which coded data pulses, representing alpha-numeric text or other message information, are transmitted in a video signal in at least one television line in field-blanking intervals where no picture signals representing normal picture information are present. (United Kingdom patent specification No. 1 370 535 discloses a television transmission system of this character, an example of which is the BBC/IBA Teletext television transmission system).

SUMMARY OF THE INVENTION

It is an object of the present invention to provide an improved phase sensitive detector which is suitable for indicating phase discrepancy between data pulses and clock pulses with acceptable accuracy in the above-mentioned situation.

According to the invention there is provided a phase sensitive detector for producing a control signal, which is indicative of a phase discrepancy between data pulses of the NRZ type and clock pulses whose cycle period is equal to a data bit period, and which can be used to correct the phase of the clock pulses to achieve a required phase relationship between the data pulses and the clock pulses, which phase sensitive detector comprises a first D-type flip-flop have a D input, a clock input and a logic output, and which phase sensitive detector is characterized in that said D input is connected to receive said data pulses and said clock input is connected to receive said clock pulses, and said phase sensitive detector further comprises a second D-type flip-flop, a D input of which is connected to the logic output of said first D-type flip-flop and a clock input of which is connected to receive said clock pulses via an inverter, the logic outputs of said first and second D-type flip-flop being connected, respectively, to respective first inputs of first and second exclusive OR-gates, outputs of which are connected to means for producing said control signal in accordance with the logic values at these gate outputs.

In a phase sensitive detector conforming to the invention, both the leading edge and the trailing edge of each data pulse are used for phase correction; that is, two phase corrections are made in respect of each data pulse. As a results it becomes possible to produce a control signal with acceptable accuracy in response to relatively short bursts of data pulses.

In a first specific embodiment of phase sensitive detector according to the invention, the logic output of said first D-type flip-flop is also connected to a second input of the second exclusive OR-gate and a second input of the first exclusive OR-gate is connected to receive said data pulses.

The first specific embodiment of phase sensitive detector is of the so-called "proportional" type in which, for each edge of each received data pulse, one logic value at the gate output of the second exclusive OR-gate constitutes a constant width reference pulse having a duration of one-half clock pulse period, while the same logic value at the gate output of the first exclusive OR-gate constitutes a variable width pulse which varies from a duration of one-half clock pulse period when the phase relation between the data pulses and the clock pulses is correct, to up to a full clock pulse period when the clock pulses are, for example, late in phase, and down to zero duration when the clock pulses are early in phase.

In a second specific embodiment of the phase sensitive detector according to the invention, third and fourth D-type flip-flops are included in which, the third flip-flop has its D input connected to receive said data pulses, its clock input connected to receive said clock pulses via said inverter, and its logic output connected to the D input of said fourth D-type flip-flop which has its clock input connected to receive said clock pulses, the logic output of said third D-type flip-flop being connected to a second input of said second exclusive OR-gate and the logic output of said fourth D-type flip-flop being connected to a second input of said first exclusive OR-gate.

This second specific embodiment of the phase sensitive detector is of the so-called "bang-bang" type in which one logic value at the gate output of the first exclusive OR-gate constitutes a constant width pulse which signifies that the clock pulses are, for example, later in phase than the data pulses, while the same logic value at the gate output of the second exclusive OR-gate constitutes a constant width pulse which signifies that the clock pulses are earlier in phase than the data pulses.

It has been found in implementing these two specific embodiments that the "proportional" type embodiment provides quicker phase correction than the "bang-bang" type embodiment which takes longer to lock into the correct phase, but the "bang-bang" type embodiment gives a better defined phase correction than the "proportional" type embodiment.

DESCRIPTION OF THE DRAWINGS

In order that the invention may be more fully understood, reference will now be made by way of example to the accompanying drawings, in which:

FIG. 10 shows explanatory pulse waveforms for the detector of FIG. 9; and

FIG. 11 shows a current source circuit for the phase sensitive detectors of FIGS. 7 and 9.

DESCRIPTION OF THE PREFERRED EMBODIMENT

Figure 1:
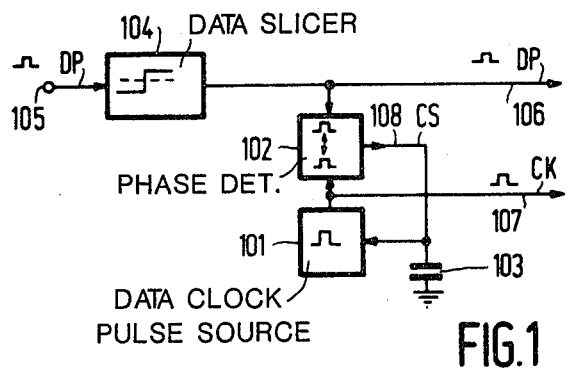
FIG. 1 shows a block diagram of a first form of data clock pulse generator.

Referring to the drawings, the data clock pulse generator shown in FIG. 1 simply comprises a data clock pulse source 101, a phase sensitive detector 102 and a storage capacitor 103. A data slicer 104 receives data pulses DP from an input terminal 105. After level correction and possibly re-shaping (by suitable known means not shown), the data pulses DP are applied to an output lead 106 for utilization in further circuitry, the pulse DP being clocked into this further circuitry by means of clock pulses CK which are applied to a clock pulse lead 107 by the source 101. The data pulses DP and the clock pulses CK are also applied to the phase sensitive detector 102 which is responsive thereto to produce a control signal CS on a control lead 108, this control signal CS having a d.c. value in accordance with the relative phase of the data pulses DP and the clock pulses CK. This control signal CS is used to vary the voltage across the capacitor 103 to provide a control voltage for correcting the phase of the source 101 so as to bring the clock pulses CK into synchronism with the data pulses DP. The source 101 may comprise in known manner a voltage-controlled oscillator, together with means for limiting and squaring the output therefrom to form the clock pulses CK. The phase sensitive detector 102 takes the form shown in FIG. 7, or in FIG. 9, as will be described.

Figure 2:
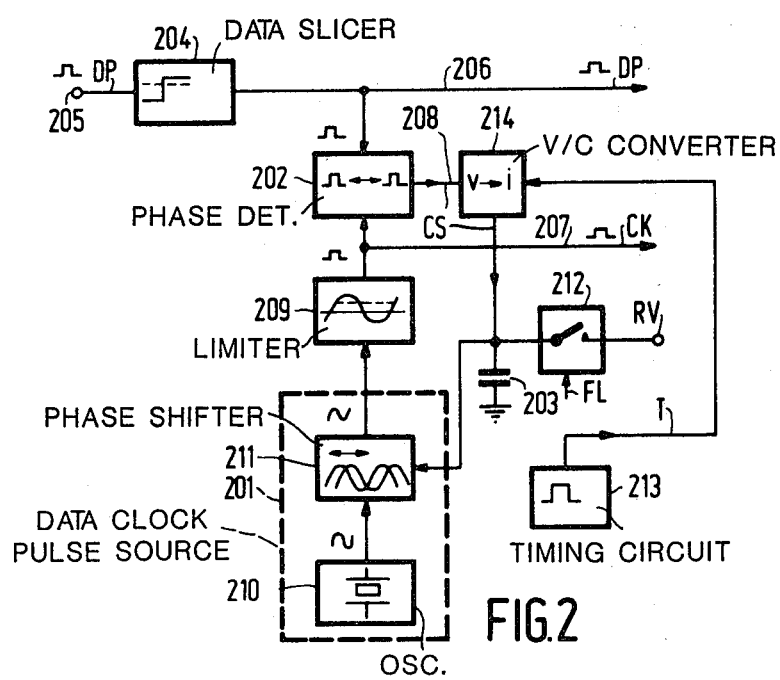
FIG. 2 shows a block diagram of a second form of data clock pulse generator.

The data clock pulse generator shown in FIG. 2 is more elaborate than that shown in FIG. 1 and has a specific application in a data pulse receiver arrangement for the aforesaid BBC/IBA Teletext television transmission system. This latter data clock pulse generator also comprises a data clock pulse source 201, a phase sensitive detector 202, a storage capacitor 203 and a data slicer 204 which receives data pulses DP from an input terminal 205 and feeds them to an output lead 206 for utilization. Also, clock pulses CK are produced on clock pulse lead 207, and a control signal CS is produced on a control lead 208. There is also shown a limiter 209 for limiting (and squaring) the output from the source 201. In this instance, the source 201 comprises a crystal-controlled oscillator 210 and a variable phase shifter 211. The oscillator 210 produces a highly stable alternating signal at the clock frequency and the phase shifter 211 is responsive in accordance with the d.c. value of the control signal CS to bring the oscillator output into phase synchronism with the data pulses DP. The phase shifter 211 can take any suitable known form, but preferably takes the form shown in our co-pending U.S. patent application Ser. No. 324,885, filed Nov. 25, 1981. The phase sensitive detector 202 again takes the form shown in FIG. 7 or in FIG. 9, as will be described.

The data clock pulse generator of FIG. 2 additionally comprises a re-setting circuit 212, a timing circuit 213 and a voltage-to-current converter circuit 214. Before considering the functions of these elements 212 to 214, which functions involve timing related to the coded data pulse transmission in the aforesaid BBC/IBA Teletext television transmission system, a digression will now be made to explain certain transmission parameters with reference to FIGS. 3a to 3c.

Figure 3:
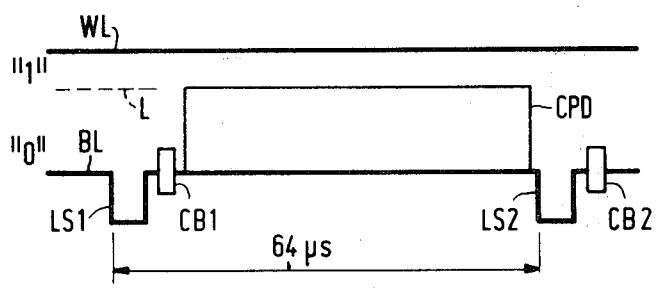
FIGS. 3a to 3c shows explanatory pulse waveforms and a coded pulse format.

FIG. 3a shows a waveform diagram which represents a Teletext television video signal for one television line which occurs in field-blanking interval and which includes coded pulse data. In this waveform diagram, the line synchronizing pulse for the television line concerned is represented at LSI, and the line synchronising pulse for the next television line is represented at LS2. The colour burst on the television line concerned and that on the next television line, are represented at CB1 and CB2, respectively. Assuming the television broadcast standards for 625-line systems as employed in the United Kingdom, the period of one television line (i.e. the period between the leading edges of successive line synchronizing pulses) is 64 μs, as indicted. Further assuming the standards adopted in the United Kingdom for information transmission by digitally coded pulses in the field-blanking intervals of such a 625-line system (see "Broadcast Teletext Specification", September 1976, published jointly by the British Broadcasting Corporation, Independent Broadcasting Authority and British Radio Equipment Manufacturer's Association), then the television line shown would be line number 17 or 18 in an even field and line number 330 or 331 in an odd field. Such a television line is referred to as a television data line and can contain coded data pulses representing 360 binary bits which may be considered as 45 eight-bit bytes. The position of the coded pulse data in the data line is indicated at CPD. The binary bit signalling rate is approximately 7 Mbit/s, and the binary bit signalling levels are defined between a black level BL and a peak white level WL. The binary '0' level is the black level BL and the binary '1' level is the level L.

Figure 3B:
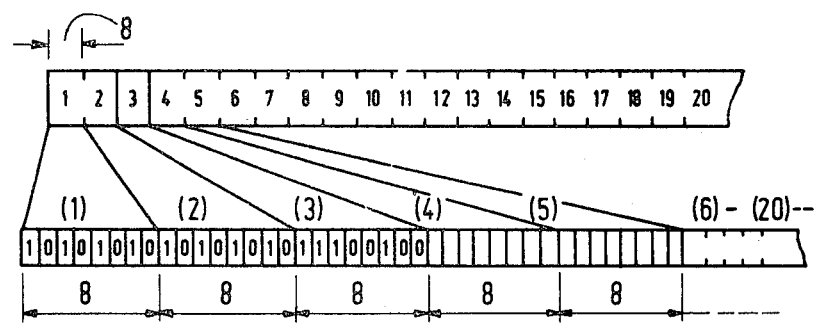

FIG. 3b shows a possible format for coded pulse data in television data line. As mentioned above, the binary bits representing the coded pulse data are divided up into eight-bit bytes 1, 2, ... 20 .... The first two bytes 1 and 2 comprise a sequence of clock run-in pulses which in the present example consist of a sequence of alternating bits 10101010/10101010. The third byte 3 comprises a framing or start code, e.g. 11100100, which a data pulse receiver arrangement has to identify before it will respond to accept message information which is contained in the remaining eight-bit bytes 4, 5 ... 20 ..

Figure 3C:
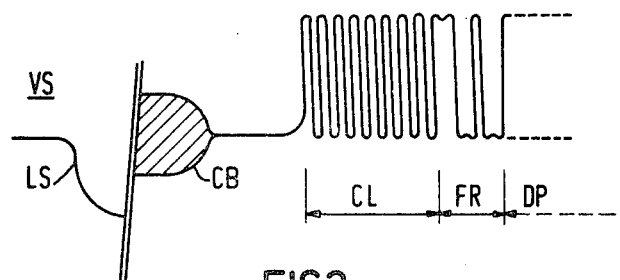

FIG. 3c shows in idealized form, the first part of a video signal waveform VS for a television data line showing the sequence of clock run-in pulses CL and the sequence of pulses which comprise the framing code FR. The first few coded data pulses which represent alpha-numeric characters or other message information are shown at DP. The line synchronizing pulse is represented at LS and the colour burst at CB.

Returning to FIG. 2, the resetting circuit 212 is so organized in relation to the above coded data pulse transmission format that in each television data line, it is operated by the line flyback pulse FL to connect a reference voltage RV across the capacitor 203 during the line blanking interval. This reference voltage RV sets the voltage across the capacitor 203 to a value corresponding to the middle of the phase range afforded by the phase shifter 211. During the ensuing period that the sequence of clock run-in pulses CL of the video signal VS occurs, the timing circuit 213 supplies to the voltage-to-current converter circuit 214 a timing pulse T which causes this circuit 214 to substantially increase (e.g. double) its current output from a normal rate in response to the control signal CS (which it receives as a voltage) so that within this relatively short clock run-in period the control voltage across the capacitor 203 as produced by the current output of the circuit 214 can assume a mean value corresponding to the mean phase of the clock run-in pulses. For the remainder of the television data line, the circuit 214 operates to product its current output at the normal, lower rate to provide a more stable control voltage about this mean value.

Figure 4:
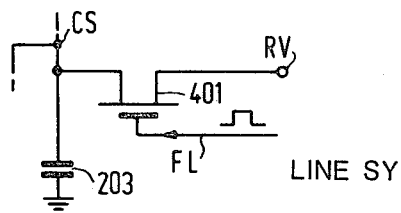
FIG. 4 shows a resetting circuit for the data clock pulse generator of FIG. 2.

The re-setting circuit 212 can take the form shown in FIG. 4, wherein it simply comprises a field-effect transistor 401 which is arranged as an electronic switch to connect the reference voltage RV across the capacitor 203 during the application of the flyback pulse FL to its gate electrode.

Figure 5:
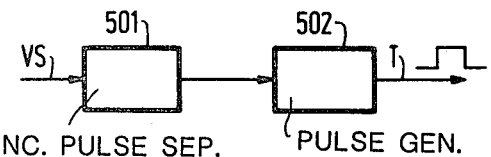
FIG. 5 shows a timing circuit for the data clock pulse generator of FIG. 2.

The timing circuit 213 can take the form shown in FIG. 5, wherein it comprises a line synchronizing pulse separator 501 and a pulse generator 502. The synchronizing pulse separator 501 detects the line sync. pulses LS in the video signal VS to trigger the pulse generator 502 which is responsive to produce the timing pulse T by which the circuit 214 is operated. The pulse generator 502 includes a trigger delay such that the timing pulse T occurs at the beginning of the sequence of clock pulses CL and lasts for substantially the duration thereof.

Figure 6:
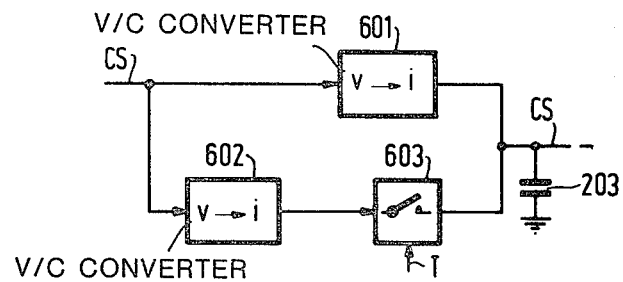
FIG. 6 shown a voltage-to-current converter circuit for the data clock pulse generator of FIG. 2.

The voltage-to-current converter circuit 214 can take the form shown in FIG. 6, wherein it comprises two converting elements 601 and 602 connected in parallel, with an electronic switch 603 (suitably comprised by a field-effect transistor in similar fashion to the transistor 401 in FIG. 4) connected in series with the element 602. During the period of the timing pulse T, which closes the switch 603, the control signal (voltage) CS is applied to both the elements 601 and 602 which thus both effect voltage-to-current conversion to feed current to the capacitor 203. When the switch 603 is open, only the element 601 is operative to feed current to the capacitor 203. The elements 601 and 602 are incorporated in the current source circuit of FIG. 11, as will be described.

Figure 7:
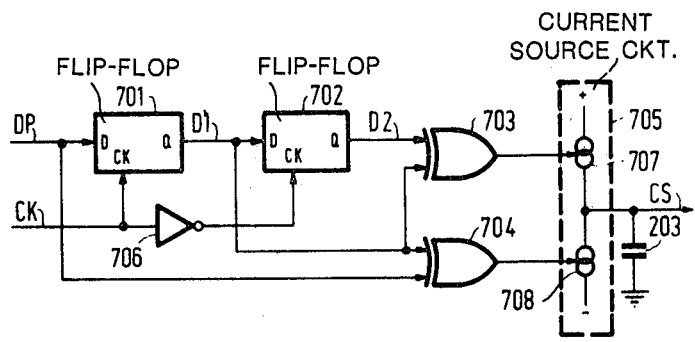
FIG. 7 shows a logic diagram of a first type of phase sensitive detector conforming to the invention.

The phase sensitive detector shown in FIG. 7 comprises two D-type flip-flops 701 and 702, two exclusive OR-gates 703 and 704, and a current source circuit 705. Each of the flip-flops 701 and 702 has a data input D, a clock input CK and a logic output Q (the other logic output $\overline{Q}$ is not shown). The data pulses DP are applied to the D-input of flip-flop 701, and Q-output of flip-flop 701 is connected to the D-input of flip-flop 702. As regards the clock pulses CK, these are applied directly to the CK-input of flip-flop 701, and, after inversion by an invertor 706, to the CK-input of flip-flop 702. The Q-output of flip-flop 701 is connected to a first input of each of the exclusive OR-gates 703 and 704. The Q-output of flip-flop 702 is connected to a second input of the exclusive OR-gate 703, and second input of the exclusive OR-gate 704 is connected to receive the data pulses DP. The outputs of the exclusive OR-gates 703 and 704 are connected, respectively, to two current sources 707 and 708 in the circuit 705. There is also shown in FIG. 7 the capacitor 203 across which the control signal voltage CS is produced.

Figure 8:
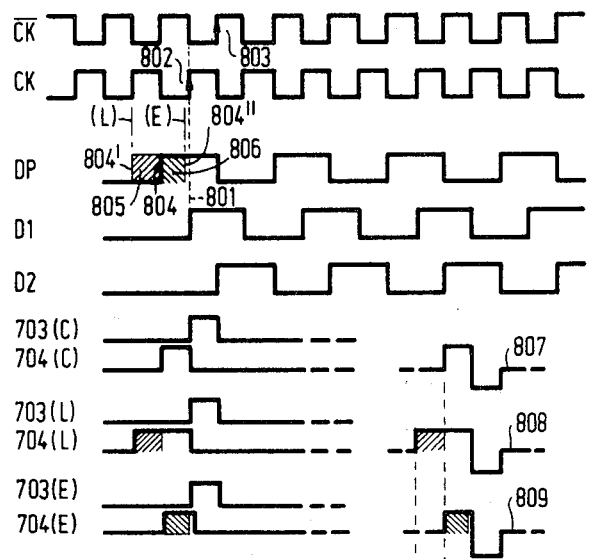
FIG. 8 shows explanatory pulse waveforms for the detector of FIG. 7.
Figure 8:
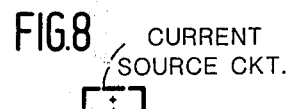

Consider now the operation of the phase sensitive detector of FIG. 7 with reference also to the explanatory pulse waveforms shown in FIG. 8. Ideally, for clocking the data pulses DP into a data pulse receiver arrangement, an edge of the clock pulses CK should occur in the center of a data pulse. This relationship, in which the clock pulses are in phase synchronism with the data pulses, is indicated in FIG. 8 by the broken line 801 which shows the rising edge 802 of a clock pulse occurring at the center of a data pulse. Thus, as regards the phase sensitive detector of FIG. 7, this relationship results in the pulse sequence D1 at the Q-output of the flip-flop 701 being delayed by one-half a clock pulse period relative to the data pulses DP at the D-input of this flip-flop 701. Since the flip-flop 702 is clocked by the rising edge 803 of the inverted clock pulses $\overline{CK}$, the pulse sequence D2 at the Q-output of the flip-flop 702, in response to the pulse sequence D1 at its D-input, is similarly delayed by one-half a clock pulse period relative to the pulse sequence D1. The one-half clock pulse period phase relationship between the pulse sequence D1 and the pulse sequence D2 remains constant irrespective of any shift in the relative phase of the data pulses DP and the clock pulses CK.

However, the variable phase relationship of the data pulses DP with respect to the pulse sequences D1 and D2 does affect the production of the outputs of the exclusive OR-gates 703 and 704, as will now be considered. When the clock pulses CK are later (L) in phase than the data pulse DP, the latter have the rising edge 804 occurring somewhere along the shaded portion 805, as indicated by 804'. On the other hand, when the clock pulses CK are earlier (E) in phase than the data pulses DP, the latter have the rising edge 804 occurring somewhere along the shaded portion 806, as indicated by 804". (It will be appreciated that the phase shifts beyond the shaded portions 805 and 806 will cause the phase situation to be in respect of the preceding of following clock pulse CK, as the case may be.)

The effects of the above three phase situations (i.e. correct, late and early) of the clock pulses CK relative to the data pulses DP in the production of the outputs of the exclusive OR-gates 703 and 704 are illustrated by the waveform diagram pairs 703(C)/704(C), 703(L)/704(L) and 703(E)/704(E), respectively. In each of these waveform diagram pairs, the output of the gate 703 (i.e. 703(C), 703(L) and 703(E)) remains the same at a duration of one-half clock pulse period regardless of the phase situation, because of the fixed phase relationship between the pulse sequences D1 and D2. On the other hand, the output of the gate 704 (i.e. 704(C), 704(L) and 704(E)) varies from a duration of one-half clock pulse period when the phase relation is correct, to up to a full clock pulse period when the phase relation is late, and down to zero duration when the phase relation is early.

The output from the exclusive OR-gate 703 controls the current source 707 to drive current into (charge) the capacitor 203 and the output from the exclusive OR-gate 704 controls the current source 708 to extract current from (discharge) the capacitor 203. Thus, the output of the gate 703 can be considered to be in anti-phase with the output of the gate 704, so that the resultant gate output for the above three phase situations can be represented by the resultant waveform diagrams 807 to 809 in FIG. 8. The charge on the capacitor 203 and hence the value of the control signal voltage CS is therefore altered proportionately as shown graphically at 810 in FIG. 8 to bring the clock pulses CK into synchronism with the data pulse DP.

In a phase sensitive detector according to the invention, as exemplified by the embodiment shown in FIG. 7, the control signal voltage CS is directly proportional to the phase error in the desired phase relationship between the data pulses DP and the clock pulses CK, so that the required phase correction of the clock pulses CK can occur quickly to lock the phase into the desired relationship. Also, the value of the control signal voltage CS does not oscillate about the correct value for the desired phase relationship, but can instead be held at that correct value, because of the possible resultant "zero" output from the exclusive OR-gates 703 and 704 when the desired phase relationship obtains. The phase sensitive detector shown in FIG. 9 comprises four D-type flip-flops 901 and 904, two exclusive OR-gates 905 and 906, and a current source circuit 907. Each of the flip-flops 901 and 904 has a data input D, a clock input CK and a logic output Q (the other logic output $\bar{Q}$ is not used). The data pulses DP are applied to the D-inputs of flip-flops 901 and 903, the Q-output of flip-flop 901 is connected to the D-input of flip-flop 902, and the Q-output of flip-flop 903 is connected to the D-input of flip-flop 904. As regards the clock pulses CK, these are applied directly to the CK-inputs of flip-flops 901 and 904 and, after inversion by an inverter 910, to the CK-inputs of flip-flops 902 and 903. The Q-outputs of flip-flops 901 and 904 are connected to respective inputs of the exclusive OR-gate 906 and the Q-outputs of flip-flops 902 and 903 are connected to respective inputs of the exclusive OR-gate 905. The outputs of the gates 905 and 906 are connected, respectively, to two current sources 908 and 909 in the circuit 907. There is also shown in FIG. 9 the capacitor 203 across which the control signal voltage CS is produced.

Figure 9:
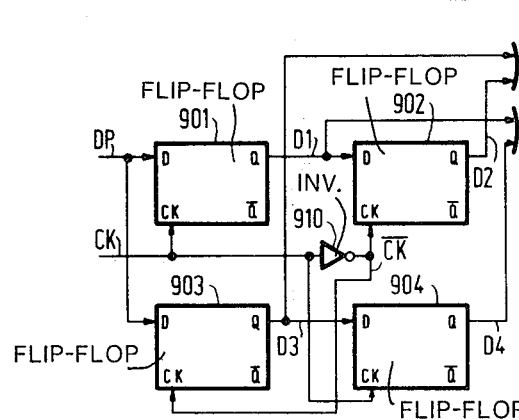
FIG. 9 shows a logic diagram of a second type of phase sensitive detector conforming to the invention.

Consider now the operation of the phase sensitive detector of FIG. 9 with reference also to the explanatory pulse waveforms shown in FIG. 10. As before, for clocking the data pulses DP into a data pulse receiver arrangement, an edge of the clock pulses CK should occur in the center of a data pulse. This relationship, in which the clock pulses are in phase synchronism with the data pulses, is indicated in FIG. 10 by the broken line IPH which shows the rising edge of a clock pulse occurring at the centre of a data pulse. Thus, as regards the phase sensitive detector of FIG. 9, this relationship results in the pulse sequence D1 at the Q-output of the flip-flop 901 being delayed by one-half clock pulse period relative to the data pulse DP at the D-input of this flip-flop. Since the flip-flop 902 is clock by the inverted clock pulses $\overline{CK}$, the pusle sequence D2 at the Q-output of the flip-flop 902, in response to the pulse sequence D1 at its D-input, is similarly delayed by one-half clock pulse period relative to the pulse sequence D1. This one-half clock pulse period phase relationship between the pulse sequence D1 and the pulse sequence D2 remains constant irrespective of any shift in the relative phase of the data pulses DP and the clock pulses CK which varies the relative phase of the data pulses DP and the pulse sequence D1.

However, this relative phase of the data pulses DP and the clock pulses CK does affect the production of the pulse sequence D3 by the flip-flop 903 and the production of the pulse sequence D4 by the flip-flop 904, as will now be considered. Consider first the case where the clock pulses CK are later (L) in phase than the data pulses DP, so that the rising edge RE1 of the inverted clock pulses $\overline{CK}$ occurs after the rising edge RE of the data pulses DP. The effect of this is to cause the flip-flop 903 to start the pulse sequence D3 with the rising edge L1. On the other hand, if the clock pulses CK are earlier (E) in phase than the data pulses DP, so that the rising edge RE1 of the inverted clock pulses $\overline{CK}$ occurs before the rising edge RE of the data pulses DP, the pulse sequence D3 will not start until its rising edge E1, when the rising edge RE2 of the inverted clock pulses $\overline{CK}$ occurs. If the pulse sequence D3 occurs early at L1, then the pulse sequence D4, as produced by the flip-flop 904, also occurs early at the rising edge L2 when the next rising edge of the clock pulses CK occurs, whereas if the pulse sequence D3 occurs late at E1, then the pulse sequence D4 also occurs late at the rising edge E2 when the next again rising edge of the clock pulses CK occurs.

Consideration of the logic levels of the pulse sequences D1 to D4 will show that when the clock pulses CK are later in phase than the data pulses DP, D3 is high when D2 is low, and both D1 and D4 are high together, so that the exclusive OR-gate 905 output is high; whereas when the clock pulse CK are earlier in phase than the data pulses DP, D1 is high when D4 is low, and both D2 and D3 are low together, so that the exclusive OR-gate 906 output is high. The output from exlusive OR-gate 905 controls the current source 908 to drive current into (charge) the capacitor 203 and the output from the exclusive OR-gate 906 controls the current source 909 to extract current from (discharge) the capacitor 203. The charge on the capacitor 203, and hence the value of the control signal voltage CS, is therefore being continously altered to tend to bring the clock pulses CK into synchronism with the received data pulses DP.

The current source circuit 705 in FIG. 7 and 907 in FIG. 9, can take the form shown in FIG. 11, wherein it comprises two transistor pairs 1901/1902 and 1903/1904 of opposite conductivity type, both pairs being connected as current mirrors. The transistors 1902 and 1904 are connected in push-pull with their collectors connected together and to the capacitor 203. The collectors of the other two transistors 1901 ad 1903 are fed, respectively, with voltage pulses 1905 and 1906 which constitute the outputs from the exclusive OR-gates 703/905 and 704/906 (FIGS. 7 and 9). An inverter 1907 inverts the pulses 1905 to form pulses 1905'. Two resistors 1908 and 1909 determine the current magnitude that flows in the transistors 1901 and 1903 in response to the voltage pulses 1905 and 1906. The resultant push-pull current in the transistors 1902 and 1904 adjusts the charge on the capacitor 203. In order to provide increased current into the capacitor circuit during the period of the clock run-in pulses CL (FIG. 3c), as mentioned previously when FIG. 2 (and FIG. 6) was being described, there is provided, as shown in the dotted line rectangle 1910, a second current source circuit which is fed with the voltage pulses 1905 and 1906. However, the output at the collectors of the push-pull transistor pair in this second current source circuit is connected to the capacitor 203 via a field-effect transistor 1911 which functions as a switch in response to the timing pulse T, so that the capacitor 203 receives current from this second current source circuit only for the duration of this timing pulse T. The current due to the second current source can be proportionally different to that due to the first current source by suitable selection of the values of the resistors such as 1908 and 1909 in the second current source.

I claim:

1. A phase sensitive detector for producing a control signal, which is indicative of phase discrepancy between data pulses of the NRZ type and clock pulses whose cycle period is equal to a data bit period and which can be used to correct the phase of the clock pulses to achieve a required phase relationship between the data pulses and the clock pulses, which phase sensitive detector comprises a first D-type flip-flop having a D input, a clock input and a logic output; characterized in that said D input of said first D-type flip-flop is connected to receive said data pulses and said clock input is connected receive said clock pulses, and said phase sensitive detector further ccomprises a second D-type flip-flop having a D input connected to the logic output of said first D-type flip-flop, a clock input connected to receive said clock pulses via an inverter and a logic output, the logic outputs of said first and second D-type flip-flops being connected, respectively, to respective first inputs of first and second exclusive OR-gates, the outputs of which are connected to means for producing said control signal in accordance with logic values at these gate outputs.

2. A phase sensitive detector as claimed in claim 1, characterized in that the logic output of said first D-type flip-flop is also connected to a second input of the second exclusive OR-gate and second input of the first exclusive OR-gate is connected to receive said data pulses.

3. a phase sensitive detector as claimed in claim 1, characterized in that said phase sensitive detector further comprises third and fourth D-type flip-flops in which the third flip-flop has a D input connected to receive said data pulses, a clock input connected to receive said clock pulses via said inverter, and a logic output connected to a D input of said fourth D-type flip-flop which in turn has a clock input connected to receive said clock pulses, the logic output of said third D-type flip-flop being connected to a second input of said second exclusive OR-gate and a logic output of said fourth D-type flip-flop being connected to a second input of said exclusive OR-gate.

4. A phase sensitive detector as claimed in any preceding claim, characterized in that said means for producing said control signal comprises a capacitor, the charge across which determines the value of the control signal, and two current sources which are controlled, respectively, by the two gate outputs for one logic value thereof to drive current into and extract current from the capacitor.

5. A phase sensitive detector as clamined in claim 4, characterized in that said two current sources comprised two transistor pairs of opposite conductivity type both pairs being connected as current mirrors, the input transistor of each pair being connected to receive at its collector the logic output from a respective one of said two gates, one output with polarity inversion, and the other two transistors, one from each pair, being connected in push-pull with their collectors connected together and to said capacitor, a respective resistor for determining the current magnitude in each current mirror transistor pair being connected between the collector of its input transistor and the respective gate output.

6. A phase sensitive detector as claimed in claim 1, 2 or 3 embodied in a data clock pulse generator in which the locally generated clock pulses are generated by a voltage-controlled oscillator which is controlled by said control signal to produce phase-corrected clock pulses.

7. A phase sensitive detector as claimed in claim 1, 2 or 3, embodied in a data clock pulse generator in which locally generated clock pulses are generated by a crystal-controlled oscillator and are applied to a phase shifter which is controlled by said control signal to produce phase-corrected clock pulses.

* * * * *